United States Patent
Chen et al.

(10) Patent No.: US 7,435,943 B1
(45) Date of Patent: Oct. 14, 2008

(54) COLOR SENSOR WITH INFRARED CORRECTION HAVING A FILTER LAYER BLOCKING A PORTION OF LIGHT OF VISIBLE SPECTRUM

(75) Inventors: Farn Hin Chen, Perak (MY); Gim Eng Chew, Penang (MY); Boon Keat Tan, Penang (MY)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 0 days.

(21) Appl. No.: 11/693,600

(22) Filed: Mar. 29, 2007

(51) Int. Cl.
*G01J 3/50* (2006.01)

(52) U.S. Cl. ..................... 250/226; 250/214.1

(58) Field of Classification Search .......... 250/226, 250/214.1, 216, 214 VT, 338.1, 338.4, 339.01, 250/339.02, 339.05; 257/82–85, 290, 440; 348/33, 164–167
See application file for complete search history.

(56) References Cited

U.S. PATENT DOCUMENTS 4,651,001 A * 3/1987 Harada et al. ............... 250/330

* cited by examiner

*Primary Examiner*—Que T Le

(57) ABSTRACT

A light sensor that generates a first output signal indicative of an intensity of light received from a predetermined direction in a first band of wavelengths is disclosed. The light sensor includes a substrate having first and second photodetectors, a first filter layer, and a controller. The photodetectors are sensitive to light in the infrared portion of the optical spectrum as well as to light in the first band of wavelengths, and generate first and second photodetector signals. The first filter layer transmits light in the first band of wavelengths and light in the infrared portion of the optical spectrum while blocking light in a portion of the visible spectrum outside of the first band of wavelengths, without altering light received by the first photodetector. The controller processes the first and second photodetector signals to produce the first output signal that is corrected for infrared in the input light.

20 Claims, 1 Drawing Sheet

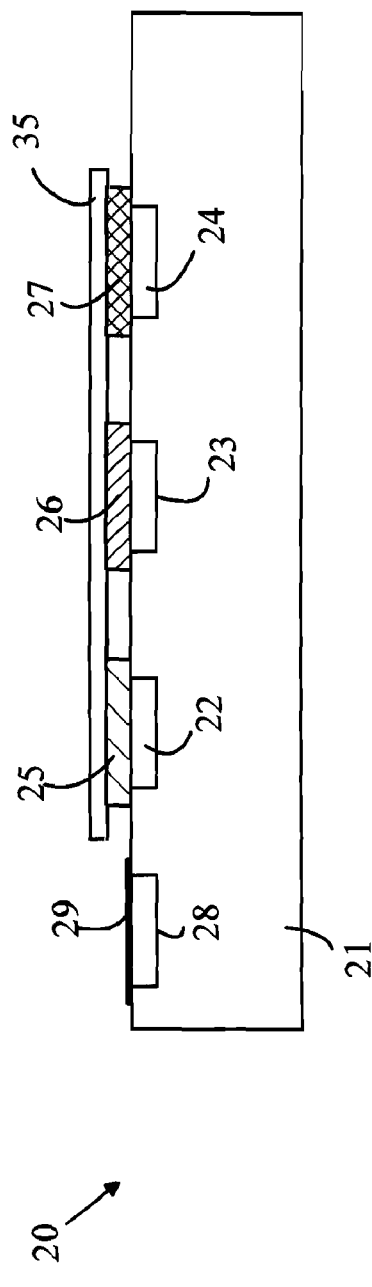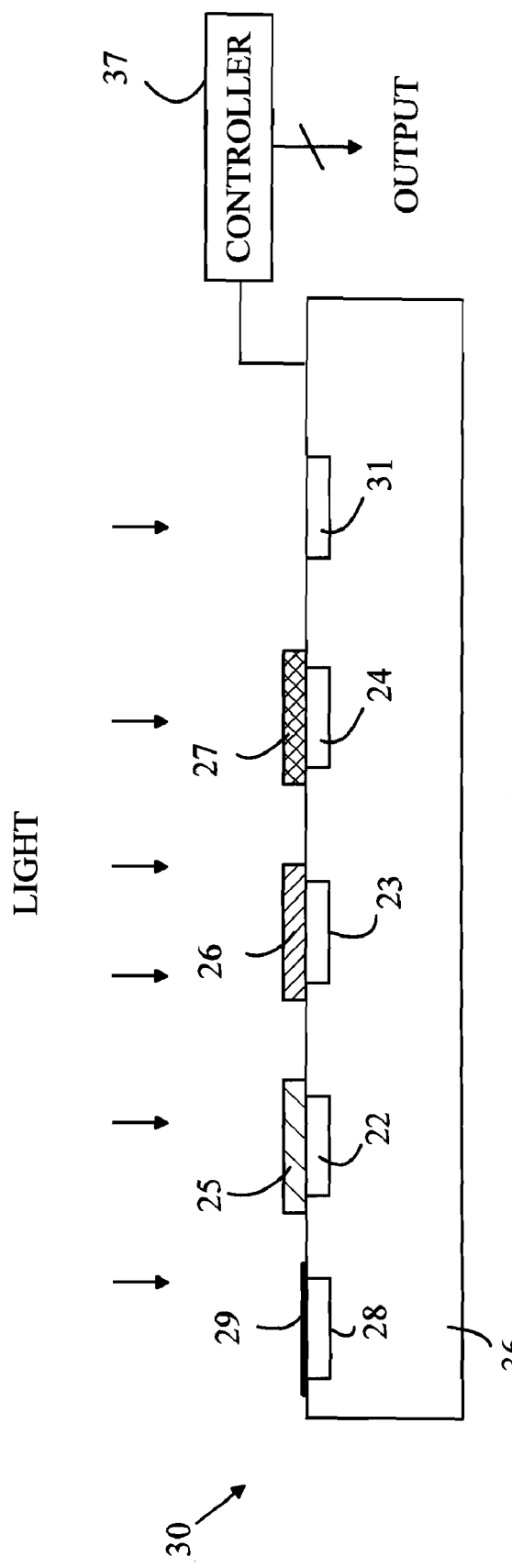

COLOR SENSOR WITH INFRARED CORRECTION HAVING A FILTER LAYER BLOCKING A PORTION OF LIGHT OF VISIBLE SPECTRUM

BACKGROUND OF THE INVENTION

Inexpensive photodetectors that measure the intensity of light in a number of wavelength bands are required in a number of devices. For example, light sources that utilize red, blue, and green LEDs to generate light that is perceived as being a particular color often utilize photodetectors in a servo loop that maintains the output of the LEDs at predetermined levels to compensate for aging. The photodetectors are used to measure the output of each LED by measuring the light generated by the LEDs in each of three spectral bands. A controller varies the average current to each LED such that the measured outputs are maintained at target values determined by the perceived color of light that is to be generated.

Each photodetector typically consists of a photodiode that is covered with a pigment filter that limits the photodiodes response to light in a corresponding band of wavelengths. The signal from the photodiode is determined by the incident light, the bandpass filter characteristics of the pigment and various background signals that are present independent of the intensity level of the light reaching the photodiode. The light-independent signals are often referred to as the "dark current". The errors generated by the dark current can be removed by measuring the output of the photodiode when no light is present and then subtracting the measured signal value from the signals generated by the photodiode in the presence of light. For example, an additional photodiode that is covered by an opaque layer that blocks all light can be included in the photodetector. The signal from this photodiode is then subtracted from that generated by the photodiodes that are covered with the various pigment filters.

Unfortunately, the pigment filters that are available for use in inexpensive photodetectors have significant transmission bands in the infrared portion of the optical spectrum as well as the bands in the desired visual region of the spectrum. In many cases, the light sources of interest also include light in the infrared region of the spectrum; hence, the signal generated by a photodiode that utilizes one of these pigment filters can include an unwanted infrared background signal if the light source includes a significant amount of infrared light. The infrared light is either generated by the light source being controlled or by background ambient light sources that introduce light into the input to the light sensor.

In some prior art systems, an infrared blocking filter is provided over the various pigment filters to block the unwanted infrared signal. However, the additional filter increases the costs of the light sensor. In addition, the infrared filters are less than 100 percent transparent in the visible region of the spectrum, and hence, the added filter over the pigment filters attenuates a portion of the light of interest, and hence, reduces the sensitivity of the light sensor.

SUMMARY OF THE INVENTION

The present invention includes a light sensor that generates a first output signal indicative of an intensity of light received from a predetermined direction in a first band of wavelengths. The light sensor includes a substrate, a first filter layer, and a controller. The substrate has first and second photodetectors that receive light from the predetermined direction. The first and second photodetectors are sensitive to light in the infrared portion of the optical spectrum as well as to light in the first band of wavelengths, and generate first and second photodetector signals that are indicative of an intensity of light received by each of the first and second photodetectors. The first filter layer transmits light in the first band of wavelengths and light in the infrared portion of the optical spectrum, the first filter layer intercepting the light before that light reaches the second photodetector. The first filter layer blocks light in a portion of the visible spectrum outside of the first band of wavelengths, but does not alter the light received by the first photodetector. The controller processes the first and second photodetector signals to produce the first output signal, the first output signal depending less on light in the infrared portion of the optical spectrum than the second photodetector signal.

In another aspect of the invention, the sensor could also include a third photodetector that generates a third photodetector signal and a light blocking layer that prevents light from entering the third photodetector. The controller could also use the third photodetector in generating the first output signal to correct for dark current.

In another aspect of the invention, additional filter layers and corresponding photodetectors could be incorporated to provide measurements of the light intensity in other spectral bands.

BRIEF DESCRIPTION OF THE DRAWINGS

FIG. 1 is a cross-sectional view of a prior art photodetector that utilizes pigment filters.

FIG. 2 is a cross-sectional view of one embodiment of a light sensor according to the present invention.

DETAILED DESCRIPTION OF THE PREFERRED EMBODIMENTS OF THE INVENTION

The manner in which the present invention provides its advantages can be more easily understood with reference to FIG. 1, which is a cross-sectional view of a prior art photodetector that utilizes pigment filters. Photodetector 20 is typically constructed from a die 21 having 4 photodiodes fabricated thereon. Photodiodes 22-24 are used to measure the intensity of light in three wavelength bands that are determined by pigment filters 25-27, respectively. Photodiode 28 is covered by an opaque layer 29 that blocks all light from reaching photodiode 28 and is utilized to measure the dark current. The pigment filters are applied by photolithographic steps that require a number of masking and deposition steps. A similar photolithographic step is needed for applying layer 29. As noted above, the pigment filters do not block infrared light from reaching the photodiodes. In principle, an additional filter layer 35 can be provided over photodiodes 22-24 that blocks the infrared light from reaching the photodiodes. However, the fabrication of such a filter significantly increases the cost of the light sensor. Furthermore, each additional filter layer reduces the amount of light that reaches the photodiodes, and hence, decreases the sensitivity of the photodetector.

The present invention overcomes these problems by including an additional photodiode that measures all of the incident light including the infrared component. The additional photodiode does not interfere with the operation of the remaining photodiodes or require additional fabrication steps. The signals from the photodiodes are then combined to provide signals that measure the intensity in each of the desired wavelength bands corrected for both the dark current and the infrared radiation that was present in the incident light.

Refer now to FIG. 2, which is a cross-sectional view of one embodiment of a light sensor according to the present invention. In this embodiment of the present invention a photodiode 31 that measures all of the light reaching the light sensor is included on substrate 36. For the purposes of this discussion, it will be assumed that the pigment layer 25 is a band pass filter that passes light in the red portion of the spectrum, pigment layer 26 is a band pass filter that passes light in the green portion of the spectrum, and pigment layer 27 is a band pass filter that passes light in the blue portion of the spectrum. As noted above, each of these pigment layers is transparent to light in the infrared portion of the spectrum. Denote the signals from photodiodes 22-24, 28, and 31 by 122, 123, 124, 128, and 131, respectively. Then $$I_{23} = f_r * I_{red} + I_d + f_{26} * I_r \quad (1)$$

$$I_{24} = f_g * I_{green} + I_d + f_{27} * I_r \quad (2)$$

$$I_{22} = f_b * I_{blue} + I_d + f_{25} * I_r \quad (3)$$

$$I_{31} = I_{red} + I_{green} + I_{blue} + I_d + I_r \quad (4)$$

$$I_{28} = I_d \quad (5)$$

Here, fr, fg, and fb are the fractions of the light in the red, green, and blue wavelength bands, respectively, that are transmitted by filters 25-27, respectively. The coefficients $f_{25}$- $f_{27}$ are the fractions of the infrared light in the input light that is transmitted by filters 25-27, respectively. And, $I_{red}$, $I_{green}$, $I_{blue}$, and $I_r$ are the intensities of the input light in the red, green, blue, and infrared regions of the spectrum. Finally, $I_d$ is the dark current. For the purposes of this example, it is assumed that all of the photodiodes are substantially identical in size and construction, and hence, the dark current is substantially the same for all of the photodiodes. For the purposes of the present discussion, two photodiodes will be said to have substantially the same construction and dark current if the differences between the individual photodiodes is within the statistical variation observed for photodiodes constructed from the same processes and mask set on a conventional integrated circuit fabrication line.

The various coefficients representing the fraction of the light that is transmitted through each filter can be measured for any light sensor. For example, the signals generated by each photodiode could be measured when the photodiodes are exposed to monochromatic light sources of various wavelengths. Hence, the system of equations shown above can be solved for $I_{red}$, $I_{green}$, and $I_{blue}$ by controller 37 to provide the corrected output, i.e., $I_{red}$, etc.

In one embodiment, the pigment filter layers 25-27 are constructed from materials that are essentially transparent to infrared radiation. That is, $f_{25} = f_{26} = f_{27} = 1$. It should be noted that, in this case, one can replace $I_d + I_r$ by I', and the system of 5 equations can be reduced to a system of 4 equations, namely, $$I_{23} = f_r * I_{red} + I' \quad (6)$$

$$I_{24} = f_g * I_{green} + I' \quad (7)$$

$$I_{22} = f_b * I_{blue} + I' \quad (8)$$

$$I_{31} = I_{red} + I_{green} + I_{blue} + I' \quad (9)$$

Since, the quantities of interest are $I_{red}$, $I_{green}$, and $I_{blue}$, the controller need only solve this simpler system of equations. As a result, the dark current measuring photodiode 28 is no longer required. Hence, this embodiment of the present invention requires no more photodiodes than the conventional light sensor. In addition, this embodiment does not require the opaque layer associated with the dark current measuring photodiode, and hence, the number of fabrication steps is substantially reduced.

The above-described embodiments of the present invention are based on an additional approximation that will now be discussed in more detail. In general, the output of the $k^{th}$ photodiode can be written in the form $$I_k = \int T_k(x) R(xd) I(x) dx \quad (10)$$

where k=red, blue, or green, $T_k(x)$ is the transmission of the $k^{th}$ filter layer as a function of wavelength, x, R(x) is the signal generated by the $k^{th}$ photodiode when illuminated with light of unit intensity as a function of wavelength, and I(x) is the intensity of the input light as a function of wavelength. The integration is performed over the entire optical spectrum, or at least the region in which all of the functions $T_k(x)$, R(x), and I(x) are non-zero. This equation can be re-written in the form:

$$I_k = \int_{visible} T_k(x) R(x) I(x) dx + \int_{infrared} T_k(x) R(x) I(x) dx \quad (11)$$

By comparing eq. (11) to eqs (1)-(5), it can be seen that eqs(1)-(3) assume that $$\int_{visible} T_k(x) R(x) I(x) dx = f_k I_k = f_k \int_k R(x) I(x) dx \quad (12)$$

independent of the shape of the intensity function I(x) and the shape of the filter functions $T_k(X)$. This assumption is not exactly satisfied for all light sources and pigment filters. However, the present invention is based on the observation that it is sufficiently correct to allow an approximate correction for any infrared light present in the input signal without requiring an additional infrared filter.

The above-described embodiments utilize three color pigment filters that provide band pass filters in the red, green, and blue regions of the visible spectrum. Such pigment color filters are known to the art, and hence, will not be discussed in detail here. For the purposes of the present discussion, it is sufficient to note that such filters are used in integrated circuits for cameras. However, embodiments that utilize filters in different spectral regions could also be constructed without departing from the teachings of the present invention.

Furthermore, the number of band pass filters can be varied from the three discussed above. For example, color filter systems based on four colors are utilized in a number of applications to provide an extended gamut for the reproduction of colors. Such systems often require light sensors that also track the intensity of the 4 component light sources. Similarly, the number of band pass filters and corresponding photodiodes could be less than 3. Light sources having a single photodiode and utilizing a feedback system to correct for aging effects are also known to the art and require a light sensor that tracks the intensity of that light source in environments that have infrared background light.

The above-described embodiments of the present invention utilize photodiodes as the photodetector. However, other forms of photodetector such as phototransistors could be utilized.

The embodiments of the present invention described above utilize photodetectors that are substantially identical to one another. However, embodiments in which the photodetectors differ substantially from one another could also be constructed provided the relationship between the light received by the photodetector and the output signal generated by the photodetector is known. For example, the photodetector used to measure the total light received by the light sensor could be a different size than the other photodetectors. In this case, the constants shown in Eqs. (1)-(9) would need to be altered to take into account the differences in construction.

Various modifications to the present invention will become apparent to those skilled in the art from the foregoing description and accompanying drawings. Accordingly, the present invention is to be limited solely by the scope of the following claims.

What is claimed is:

1. A light sensor that generates a first output signal indicative of an intensity of light received from a predetermined direction in a first band of wavelengths, said light sensor comprising:
   a substrate having first and second photodetectors that receive light from said predetermined direction, said first and second photodetectors being sensitive to light in the infrared portion of the optical spectrum as well as to light in said first band of wavelengths, said first and second photodetectors generating first and second photodetector signals, indicative of an intensity of light received by each of said first and second photodetectors, respectively;
   a first filter layer that transmits light in said first band of wavelengths and light in the infrared portion of the optical spectrum, said first filter layer intercepting light from said predetermined direction before said light reaches said second photodetector and blocking light in a portion of the visible spectrum outside of said first band of wavelengths, said first filter layer not altering light received by said first photodetector; and
   a controller that processes said first and second photodetector signals to produce said first output signal, said first output signal depending less on light in said infrared portion of the optical spectrum than said second photodetector signal.

2. The light sensor of claim 1 further comprising a third photodetector that generates a third photodetector signal and a light blocking layer that prevents light from entering said third photodetector, said controller utilizing said third photodetector in generating said first output signal.

3. The light sensor of claim 1 further comprising a fourth photodetector that generates a fourth photodetector signal and a second filter layer that transmits light in a second band of wavelengths that is different from said first band of wavelengths, said second filter layer intercepting light from said predetermined direction before said light reaches said fourth photodetector and blocking light in a portion of the visible spectrum outside of said second band of wavelengths, said second filter layer not altering light received by said first photodetector, wherein said controller generates a second output signal that depends less on light in said infrared portion of the optical spectrum than said fourth photodetector signal.

4. The light sensor of claim 1 wherein said photodetectors generate dark currents having substantially the same magnitude.

5. The light sensor of claim 1 wherein said photodetectors are substantially identical to one another.

6. The light sensor of claim 1 wherein said photodetectors comprise photodiodes.

7. The light sensor of claim 1 wherein said photodetectors comprise phototransistors.

8. A method for generating a first estimate of an intensity of light received from a predetermined direction in a first band of wavelengths, said method comprising:
   providing a substrate having first and second photodetectors that receives light from said predetermined direction, said first and second photodetectors being sensitive to light in the infrared portion of the optical spectrum as well as to light in said first band of wavelengths, said first and second photodetectors generating first and second photodetector signals, indicative of an intensity of light received by each of said first and second photodetectors, respectively;
   providing a first filter layer that transmits light in said first band of wavelengths and light in the infrared portion of the optical spectrum, said first filter layer intercepting light from said predetermined direction before said light reaches said second photodetector and blocking light in a portion of the visible spectrum outside of said first band of wavelengths, said first filter layer not altering light received by said first photodetector; and
   processing said first and second photodetector signals to produce said first estimate, said first estimate depending less on light in said infrared portion of the optical spectrum than said second photodetector signal.

9. The method of claim 8 further comprising providing a third photodetector that generates a third photodetector signal and a light blocking layer that prevents light from entering said third photodetector, and using said third photodetector signal in generating said first estimate.

10. The method of claim 8 further comprising providing a fourth photodetector that generates a fourth photodetector signal and a second filter layer that transmits light in a second band of wavelengths that is different from said first band of wavelengths, said second filter layer intercepting light from said predetermined direction before said light reaches said fourth photodetector and blocking light in a portion of the visible spectrum outside of said second band of wavelengths, said second filter layer not altering light received by said first photodetector, and generating a second estimate of a light intensity in a second band of wavelengths, said second estimate depending less on light in said infrared portion of the optical spectrum than said fourth photodetector signal.

11. The method of claim 8 wherein said photodetectors generate dark currents having substantially the same magnitude.

12. The method of claim 8 wherein said photodetectors are substantially identical to one another.

13. The method of claim 8 wherein said photodetectors comprise photodiodes.

14. The method of claim 13 wherein said photodiodes have substantially the same size.

15. The method of claim 8 wherein said photodetectors comprise phototransistors.

16. A method for fabricating a light sensor, said method comprising the steps of
   providing a substrate having first and second photodetectors that receive light from said predetermined direction, said first and second photodetectors being sensitive to light in the infrared portion of the optical spectrum as well as to light in a first band of wavelengths, said first and second photodetectors generating first and second photodetector signals, indicative of an intensity of light received by each of said first and second photodetectors, respectively; and depositing a first filter layer that transmits light in said first band of wavelengths and light in the infrared portion of the optical spectrum, said first filter layer intercepting light from said predetermined direction before said light reaches said second photodetector and blocking light in a portion of the visible spectrum outside of said first band of wavelengths, said first filter layer not altering light received by said first photodetector.

17. The method of claim 16 wherein said substrate further comprises a third photodetector that generates a third photodetector signal and wherein a light blocking layer that prevents light from entering said third photodetector is deposited over said third photodetector.

18. The method of claim 16 wherein said substrate further comprises a fourth photodetector that generates a fourth photodetector signal and wherein a second filter layer that transmits light in a second band of wavelengths that is different from said first band of wavelengths is deposited over said fourth photodetector, said second filter layer intercepting light from said predetermined direction before said light reaches said fourth photodetector and blocking light in a portion of the visible spectrum outside of said second band of wavelengths, said second filter layer not altering light received by said first photodetector.

19. The method of claim 16 wherein said photodetectors generate dark currents having substantially the same magnitude.

20. The method of claim 19 wherein said photodetectors comprise photodiodes having substantially the same size.

* * * * *